United States Patent [19]

Flournoy et al.

[11] 3,995,179

[45] Nov. 30, 1976

[54] DAMPING STRUCTURE FOR ULTRASONIC PIEZOELECTRIC TRANSDUCER

[75] Inventors: Norman E. Flournoy; David A. Morris, both of Richmond, Va.

[73] Assignee: Texaco Inc., New York, N.Y.

[22] Filed: Dec. 30, 1974

[21] Appl. No.: 537,162

[52] U.S. Cl. .............................. 310/8.2; 73/67.5 R; 310/9.1; 340/8 FT; 340/10

[51] Int. Cl.$^2$ .......................................... H01L 41/08

[58] Field of Search ............... 310/8.2, 8.3, 8.7, 9.1, 310/9.4; 340/8 FT, 8 MM; 73/67.5 SS

[56] References Cited

UNITED STATES PATENTS

| | | | |
|---|---|---|---|
| 2,728,869 | 12/1955 | Pohlman | 310/8.7 |
| 2,803,129 | 8/1957 | Bradfield | 310/8.2 X |
| 2,881,336 | 4/1959 | Elion | 310/8.2 |
| 2,972,068 | 2/1961 | Howry et al. | 310/8.2 |
| 2,984,756 | 5/1961 | Bradfield | 310/8.7 X |
| 3,403,271 | 9/1968 | Lobdell et al. | 310/8.2 |
| 3,794,866 | 2/1974 | McElroy | 310/8.7 X |

FOREIGN PATENTS OR APPLICATIONS

| | | | |
|---|---|---|---|
| 1,086,640 | 10/1967 | United Kingdom | 310/8.2 |

*Primary Examiner*—Mark O. Budd
*Attorney, Agent, or Firm*—Thomas H. Whaley; Carl G. Ries; Henry C. Dearborn

[57] ABSTRACT

An ultrasonic transducer that employs a piezoelectric crystal which is made of lead metaniobate so that it has good sensitivity while also having a low Q. The transducer includes a backing support for one face of the crystal which provides damping of the acoustic energy being generated in the reverse direction. The backing support includes an epoxy resin with heavy metal objects moulded therein.

1 Claim, 5 Drawing Figures

DAMPING STRUCTURE FOR ULTRASONIC PIEZOELECTRIC TRANSDUCER

BACKGROUND OF THE INVENTION

1. Field of the Invention

This invention concerns transducers, in general, and more specifically relates to improved structure for an ultrasonic transducer. In the field of measuring and testing, use is often made of ultrasonic acoustic energy in order to test thickness of a material by a reflection procedure. In such procedure electrical energy is transformed into an acoustic pulse, and such acoustic energy is then reflected from the surfaces of the material to be tested. Such a transducer may be employed in connection with testing thickness of the walls of a pipe which carries a liquid.

2. Description of the Prior Art

Heretofore, transducers for use in the above indicated field have had the drawback that the pulse of acoustic energy which is produced is lacking in short time duration characteristics. A principal aspect of this drawback relates to the mounting for the piezoelectric crystal which produces the acoustic pulse. It has heretofore been difficult to minimize the ringing effects that develop from the backing portion of the crystal mounting. Of course, more recent piezoelectric crystal material that has increased sensitivity, makes the problem worse.

Because of the difficulties with ringing effects, the determination of thickness of pipes or the like is limited by the duration of the first reflected pulse which may last too long and interfere with the second reflection pulse that follows thereafter.

Consequently, it is an object of this invention to provide a superior transducer for use with ultrasonic applications. Such transducer employs a lead metaniobate crystal with backing support that is superior to known combinations and consequently provides sharper acoustic pulses.

SUMMARY OF THE INVENTION

Briefly, the invention concerns an ultrasonic transducer for use in measuring and testing. The transducer comprises in combination a piezoelectric crystal made of lead metaniobate, and means for mounting said crystal for directing ultrasonic energy outward from one face thereof. The mounting means comprises backing support means in contact with another face of said crystal including an epoxy resin and heavy metal objects moulded therein for damping ultrasonic energy generated by said other face.

Again briefly, the invention concerns an ultrasonic transducer for use in measuring and testing which comprises in combination a piezoelectric crystal made of lead metaniobate and having silvered electrodes on parallel faces thereof. It also comprises an acoustic lens mounted against one of said electrodes for focusing acoustic energy generated by said crystal, and a backing support mounted against the other of said electrodes for damping said generated acoustic energy. The said backing support comprises an epoxy resin having heavy metal objects moulded therein.

BRIEF DESCRIPTION OF THE DRAWINGS

The foregoing and other objects and benefits of the invention will be more fully set forth below in connection with the best mode contemplated by the inventors of carrying out the invention, and in connection with which there are illustrations provided in the drawings, wherein:

FIG. 1 is schematic illustration showing a transducer according to the invention being used in connection with measuring the thickness of a pipe wall or the like;

DESCRIPTION OF THE PREFERRED EMBODIMENTS

Figure 1:
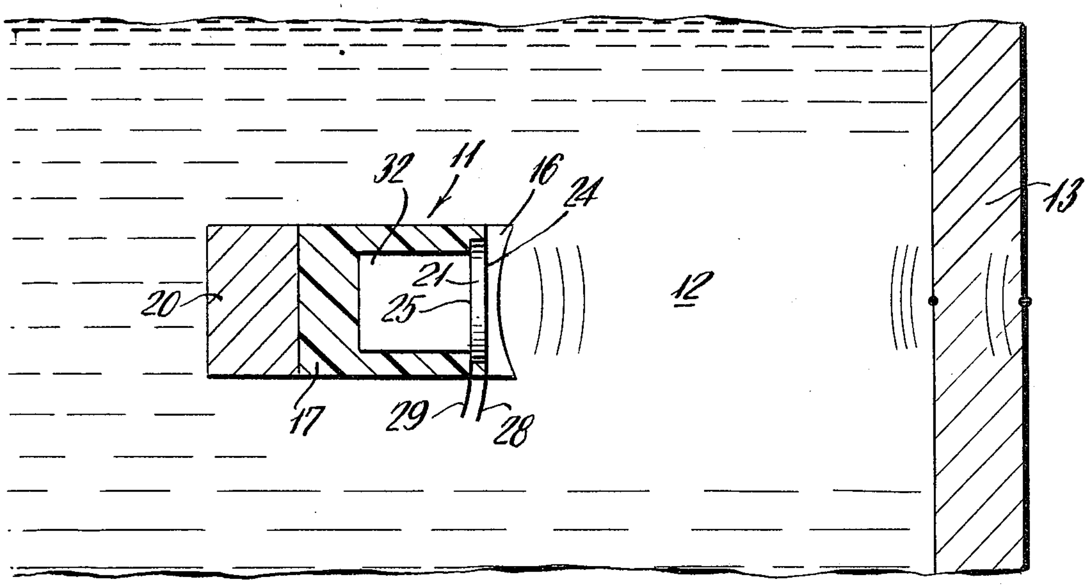

FIG. 1 is a schematic illustration showing a transducer combination in a use which is particularly applicable to this type of transducer. A transducer 11 is located in a liquid 12 that is inside of a container such as a pipe, which has a wall 13. The transducer will be energized so as to produce a short duration pulse of acoustic energy that will pass through a lens 16 on the transducer 11, so as to focus the energy toward the wall 13 of the pipe, or other container. The transducer 11 also includes a plastic material housing 17 that is mounted on a metallic support 20. The housing 17 contains a transducer crystal 21 which has silvered faces 24 and 25 that act as electrodes for applying voltages to cause the crystal 21 to deform in a conventional manner. There are circuit wires 28 and 29 for making the electrical connections to the electrodes 24 and 25 respectively.

It should be noted that this invention applies to a transducer which makes use of a piezoelectric crystal 21 which is made of lead metaniobate in order to obtain the desirable characteristics thereof. The crystal 21 is mounted in the housing 17 with a backing material section 32 that acts to damp the acoustic energy which is developed by the face 25 of the crystal 21. This helps to produce a substantially uni-directional ultrasonic frequency acoustic energy pulse from the face 24 of the crystal, while also damping any ringing effects both from the generated pulse and when returning pulses are picked up by the crystal 21.

Figure 2:
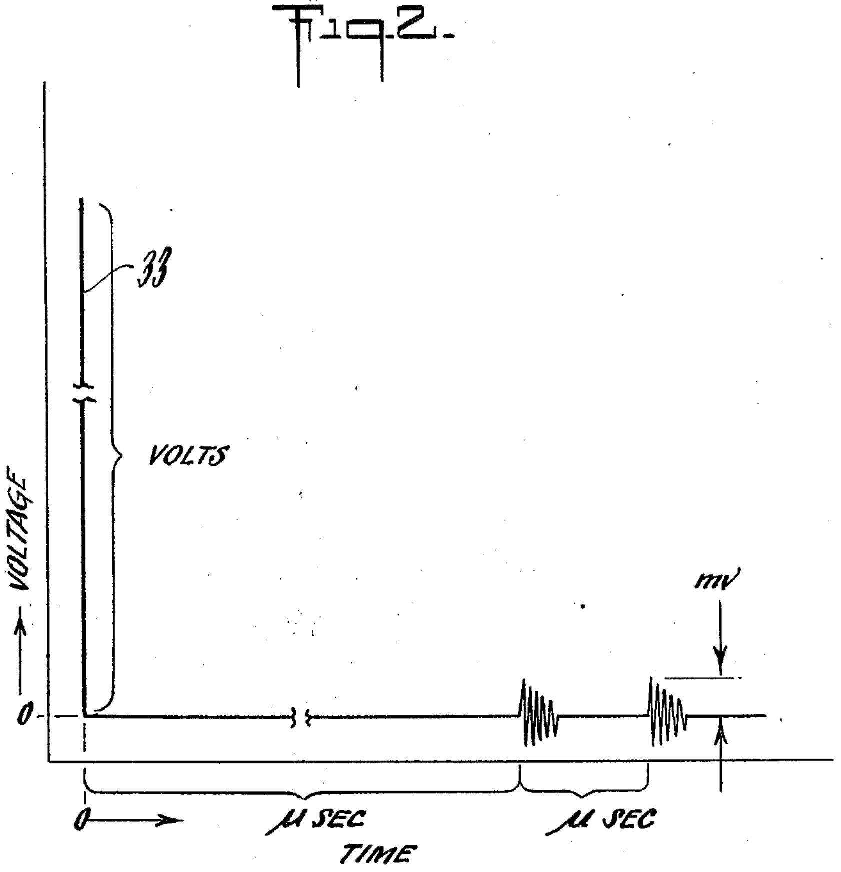
FIG. 2 is a graph illustrating a pulse and the reflection signals therefrom being returned from the walls of a pipe (or the like) with the transducer situated as indicated in FIG. 1.

FIG. 2 illustrates graphically the electrical signals that are related to a wall thickness measurement. Thus, as indicated in the FIG. 1 schematic diagram, when an acoustic pulse is created by applying an electrical voltage pulse to the crystal via the electrodes 24 and 25, it will produce a short time duration pulse of acoustic energy that is focused by passing through the lens 16 and then travels through the fluid 12 towards the wall 13 of the pipe. The electrical voltage pulse is indicated in FIG. 2 by a broken vertical line 33 that represents a voltage with magnitude of about 50–100 volts. This is applied at time 0 on the graph, and the acoustic pulse that is generated travels through the fluid 12. Then, as indicated, it passes through the wall 13 where reflections are generated from both faces of the wall. The reflected acoustic energy returns and impinges upon the crystal 21 after a time delay following the application of the voltage pulse 33. Such returning acoustic energy pulses generate electrical pulse signals, as indicated by reference numbers 36 and 37. These are the electrical signals generated by the acoustic energy reflections returning from the inner and outer faces of the wall 13. It will be observed that in the example schematically illustrated, the dimensions of the pipe wall and the location of the transducer are such that the time intervals involved are very short. Thus, it will be observed that the abscissa scale of the FIG. 2 graph is in microseconds.

It will be noted that, as indicated above, the time separation between reflected pulses 36 and 37 is quite short (being a matter of microseconds) so that in the absence of a transducer according to this invention, the wall thickness that could be measured would be limited to a substantial thickness. In other words, if the wall 13 should be less than something quite thick, there would be an overlap of the pulses being reflected back. However, a transducer combination according to this invention provides sharp and short duration characteristics in the pulse originally developed at the crystal 21, so that the reflected pulses returning are correspondingly short duration which permits better separation.

The piezoelectric material lead metaniobate has good sensitivity for ultrasonic vibrations while also having a fairly low Q characteristic. Such Q characteristic is the ratio of the central frequency to the band width of frequencies to which a particular crystal will respond.

Figure 3:
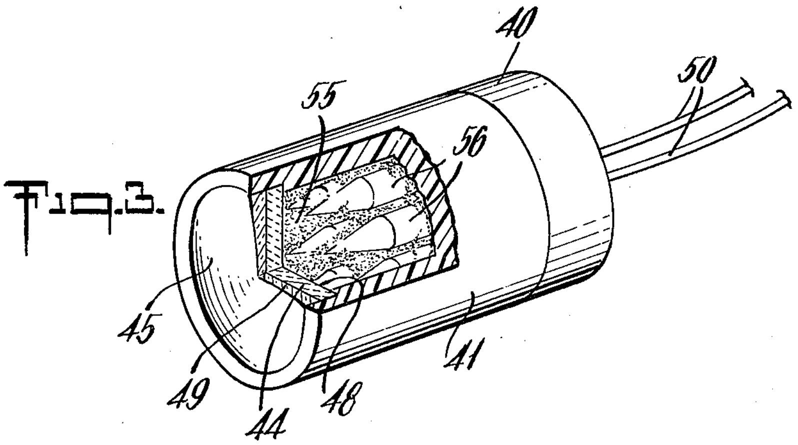
FIG. 3 is a schematic perspective, broken away in cross section to show interior structure of a transducer in accordance with invention.
Figure 4:
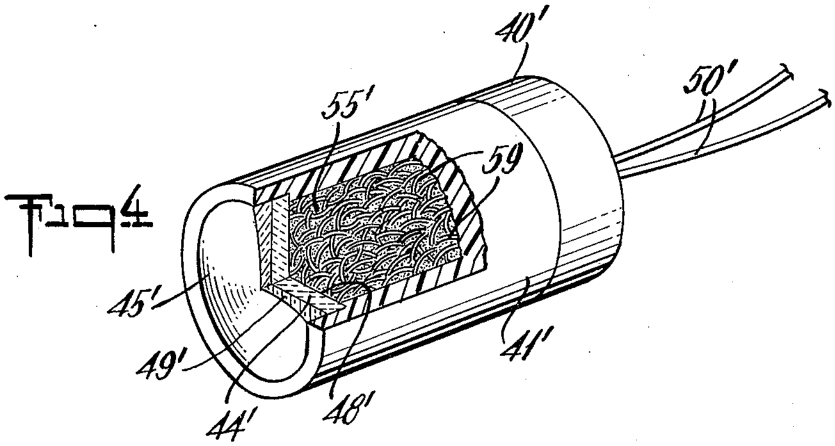
FIG. 4 is another schematic perspective of a different modification, showing another transducer according to the invention.

FIGS. 3 and 4 illustrate typical structures for transducers which are in accordance with the schematic indication of FIG. 1. However, these structures are substantially alike except for the damping means in the backing section of each. Therefore, the corresponding elements of FIG. 4 which are the same as those of FIG. 3 will have the same reference numbers, with prime marks added.

Referring to FIG. 3 there is a metallic support 40 which has a plastic material housing 41 mounted thereon. The housing 41 retains a piezoelectric crystal 44 which, as indicated above, is made of lead metaniobate. On the outside of crystal 44 there is a lens 45 which acts to focus the acoustic energy that is developed by the crystal 44. It will be understood that the crystal 44 has silvered faces, or electrodes 48 and 49 which are electrically connected to circuit wires 50 in any feasible manner.

Mounted against the face 48 of the crystal 44, there is a backing support 55 which is made up of an epoxy resin and which has moulded into it a plurality of pointed steel rods 56. These rods 56 are set with their points toward the face 48 but spaced therefrom. They act as damping means for acoustic energy that is developed by the face 48 of the crystal 44. These help dissipate and so damp out the energy travelling back into the transducer, so that the desired acoustic pulse generated by, and going out from the front face 49 is not interfered with.

FIG. 4 is another modification of a transducer combination according to the invention. The elements that are unchanged are given the same reference numbers (with prime marks) as those numbers employed in FIG. 3 illustration. Thus, it will be observed that the difference in this modification is only in the particular type of heavy metal objects that are moulded into the backing support 55'. In this case there are a large plurality of twisted rods of solder 59 that act as the heavy metal objects which dissipate and damp out the acoustic energy developed by the inner face 48' of the crystal 44'.

Figure 5:
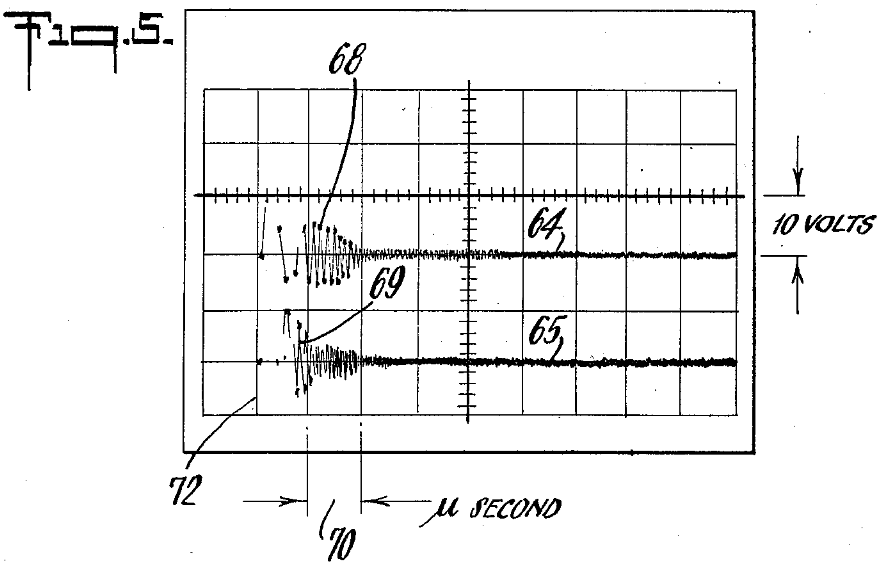
FIG. 5 is a reproduction of an oscillograph illustrating two ultrasonic pulse signals which compare the results from a transducer according to the invention with a prior art type.

FIG. 5 shows a pair of oscillograph traces 64 and 65 which illustrate the improved characteristics of an acoustic pulse as generated by a transducer which employs the combination according to this invention, as compared to a transducer having a plain epoxy backing support. The upper trace 64 is that generated by the transducer with the plain epoxy backing.

It will be observed that a pulse 68 on the trace 64 has a much longer time duration or ringing characteristic before being dissipated or damped substantially, than does a corresponding pulse 69 on the trace 65. The trace 65 and pulse 69 thereon illustrates an improved characteristics pulse which is obtained by employing a transducer having a combination of elements in accordance with this invention. It should be noted that both pulses 68 and 69 are being displayed by cathode ray oscilloscope and the sweep time base (indicated by reference number 70) is 1 microsecond. The vertical deflection is set at 10 volts per major division on the scope. The two traces are presented so that they both commenced at the same time, as indicated by a vertical time line 72, and the initial voltage pulse was about 80 volts lasting for ½ microsecond. Thus, it will be observed that the pulse 69 which was created by a combination according to this invention, is substantially damped out within about one microsecond in total duration while the other pulse 68 lasts almost twice as long.

While particular embodiments of the invention have been described above in accordance with the applicable statutes this is not to be taken as in any way limiting the invention but merely as being descriptives thereof.

We claim:

1. An ultrasonic transducer for use in measuring and testing, comprising in combination a piezoelectric crystal made of lead metaniobate and having silvered electrodes on parallel faces thereof, an acoustic lens mounted against one of said electrodes for focusing acoustic energy generated by said crystal, and a backing support mounted against the other of said electrodes for damping said generated acoustic energy, said backing support comprising an epoxy resin having a plurality of pointed steel rods moulded therein and situated with the points toward said other of said electrodes.

* * * * *